US007783945B2

(12) United States Patent
Chen et al.

(10) Patent No.: US 7,783,945 B2
(45) Date of Patent: Aug. 24, 2010

(54) DISPLAY APPARATUS AND TEST CIRCUIT THEREOF

(75) Inventors: Chi-Wen Chen, Hsinchu (TW); Li-Wei Shih, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 689 days.

(21) Appl. No.: 11/696,886

(22) Filed: Apr. 5, 2007

(65) Prior Publication Data

US 2008/0077832 A1 Mar. 27, 2008

(51) Int. Cl.
*G01R 31/28* (2006.01)
*G06F 11/00* (2006.01)

(52) U.S. Cl. .......................................... 714/724; 714/36

(58) Field of Classification Search ................. 714/724, 714/721, 740, 799, 743, 22, 36, 14; 324/765, 324/675

See application file for complete search history.

(56) References Cited

U.S. PATENT DOCUMENTS 4,628,443 A * 12/1986 Rickard et al. ................ 700/79
5,627,478 A * 5/1997 Habersetzer et al. ........ 324/763
6,160,413 A * 12/2000 Habersetzer et al. ........ 324/763
6,323,457 B1 * 11/2001 Jung ..................... 219/121.83
7,679,595 B2 * 3/2010 Luo et al. ..................... 345/98

* cited by examiner

*Primary Examiner*—Phung M Chung
(74) *Attorney, Agent, or Firm*—Thomas, Kayden, Horstemeyer & Risley

(57) ABSTRACT

A display apparatus comprises a pixel array, a front-end circuit, a test circuit, and an enable circuit. The test circuit tests the pixel array. The enable circuit determines whether to enable the test circuit in response to a predetermined voltage. After the pixel array is tested, the predetermined voltage is provided by the front-end circuit to disable the test circuit.

6 Claims, 3 Drawing Sheets

DISPLAY APPARATUS AND TEST CIRCUIT THEREOF

This application claims the benefit of priority based on Taiwan Patent Application No. 095135790, filed Sep. 27, 2006, the disclosure of which is incorporated herein by reference in its entirety.

CROSS-REFERENCES TO RELATED APPLICATIONS

Not applicable.

BACKGROUND OF THE INVENTION

1. Field of the Invention

The present invention relates to a display apparatus and a test circuit; more specifically, relates to a display apparatus and a test circuit for determining whether to enable the test circuit in response to a predetermined voltage, and for disabling the test circuit after testing.

2. Descriptions of the Related Art

In recent years, flat panel displays have been developed rapidly, and have gradually replaced traditional cathode radiation tube displays. Presently, major flat panel displays include: organic light-emitting diode (OLED) displays, plasma display panels (PDPs), liquid crystal displays (LCDs), and field emission displays (FEDs). In any of the flat panel displays mentioned above, a corresponding display array circuit should be tested during manufacturing to ensure proper operation.

FIG. 1 is a schematic diagram illustrating the testing of a flat panel display of the prior art. The flat panel display comprises a display array 101 and a test unit 103. The display array 101 comprises multiple electrode leading wires, with the test unit 103 electrically connected to the display array 101 via an enable unit 105. The enable unit 105 determines whether to input test signals to the electrode leading wires in response to the enable signal 100.

After testing a prior art flat panel display, either the electrical connection between the test unit 103 and the display array 101 is cut off, or the enable unit 105 stays in a floating state without connecting to any signal. An anisotropic conductive film (ACF) is used for connecting the display array 101 with other printed circuit boards or driver ICs. However, the enable unit 105 in the floating state is still disposed in the flat panel display. The ACF connected with other components and/or signals may lead to other signals being electrically coupled to the enable unit 105. The electrically coupled signals may activate the enable unit 105 and further cause the display array 101 to display an abnormal screen. Consequently, it is important for this industry to develop a method that eliminates the display of an abnormal screen caused by the original test unit 103 and the enable unit 105 after the testing of the flat panel display.

SUMMARY OF THE INVENTION

One objective of this invention is to provide a test circuit adapted for a display apparatus. The display apparatus comprises a pixel array and a front-end circuit. The test unit tests the pixel array. The enable unit determines whether to enable the test unit in response to a predetermined voltage. The predetermined voltage is provided by the front-end circuit to disable the test unit after the pixel array is tested.

Another objective of this invention is to provide a display apparatus which comprises a pixel array, a front-end circuit, a test circuit and an enable circuit. The test circuit tests the pixel array. The enable circuit determines whether to enable the test circuit in response to the predetermined voltage. Provided by the front-end circuit, the predetermined voltage disables the test circuit after the pixel array is tested.

This invention provides a predetermined voltage for the enable circuit to determine whether to enable the test circuit. After testing, the predetermined voltage is continuously provided (though, the voltage level changes) such that the enable circuit is disabled while the display apparatus is operating. Consequently, the pixel array of the display apparatus can operate normally without being affected by the test circuit and the enable circuit, resulting in a normal display. The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
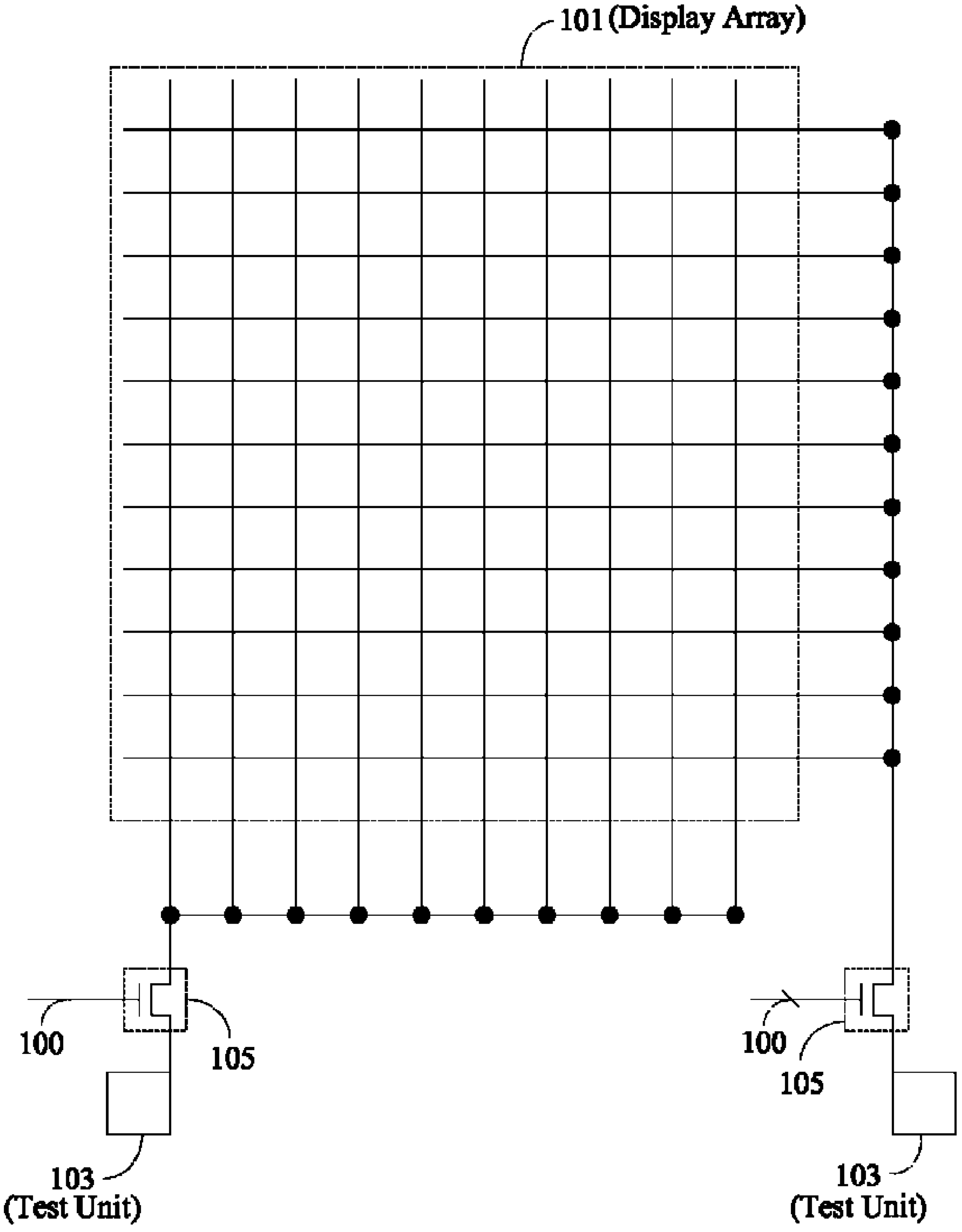
FIG. 1 (Prior Art)
FIG. 1 is a schematic diagram illustrating a flat panel display of the prior art.
Figure 2:
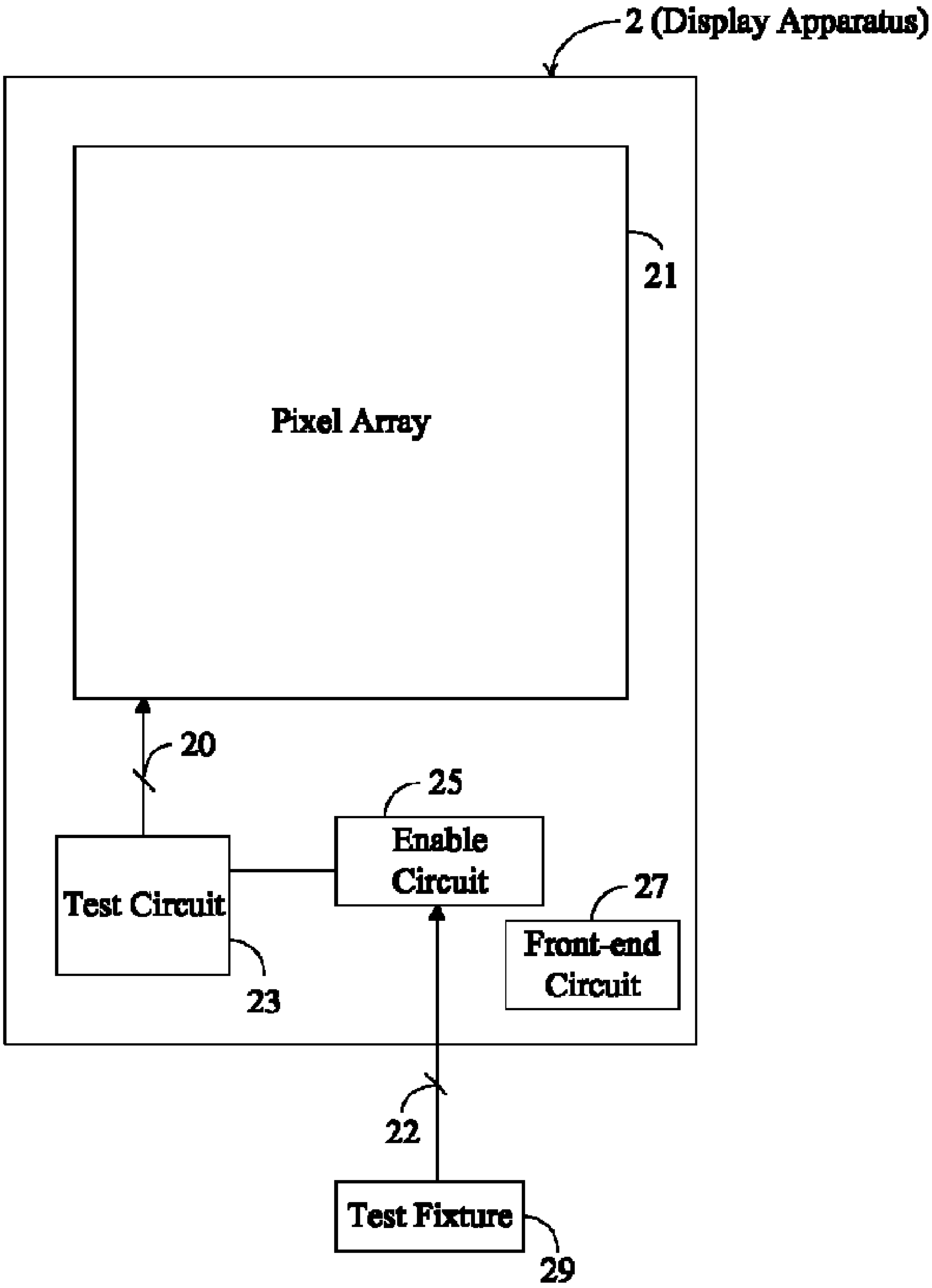
FIG. 2 is a schematic diagram illustrating a preferred embodiment of the invention.

As shown in FIG. 2, a preferred embodiment of the invention is a display apparatus 2. The display apparatus 2 comprises a pixel array 21, a test circuit 23, an enable circuit 25, and a front-end circuit 27. While testing, the display apparatus 2 is electrically connected to a test fixture 29, which could provide a predetermined voltage 22 for determining whether to enable the test circuit 23. For this preferred embodiment, the enable circuit 25 is enabled while the predetermined voltage 22 stays at a high voltage level such that a test signal 20 provided by the test circuit 23 is inputted to the pixel array 21, and the pixel array 21 can be tested. Likewise, the enable circuit 25 is disabled while the predetermined voltage 22 stays at a low voltage level such that the test signal 20 provided by the test circuit 23 is not inputted to the pixel array 21, and the pixel array 21 can not be tested.

Figure 3:
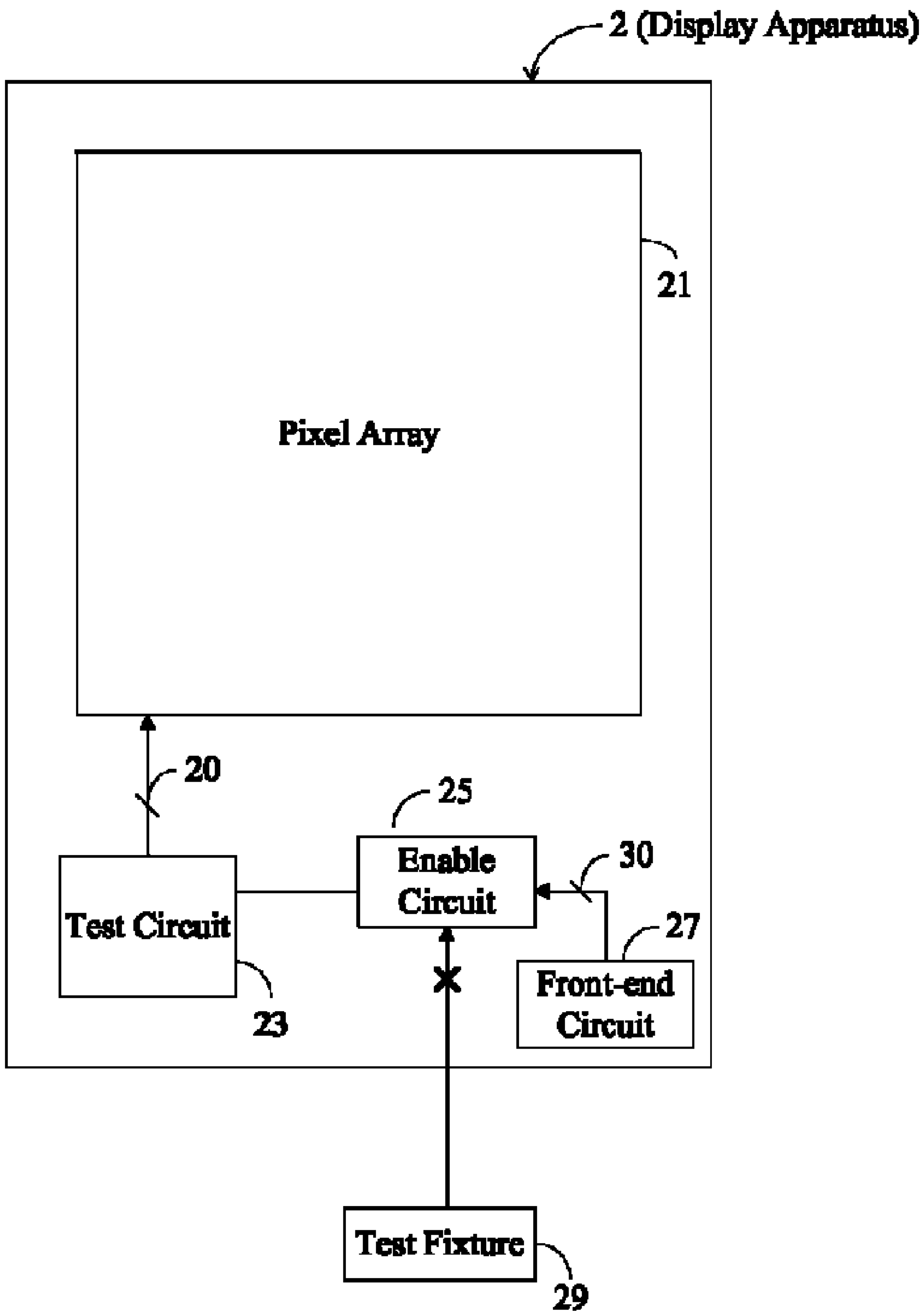
FIG. 3 is another schematic diagram illustrating the preferred embodiment of the invention.

While testing the pixel array 21, the predetermined voltage 22 is provided by the test fixture 29 to control the moment when the test circuit 23 sends the test signal 20 to the pixel array 21. As shown in FIG. 3, after testing the pixel array 21, other components are put into the display apparatus 2, to prevent the test fixture 29 from sending the predetermined voltage 22 to the enable circuit 25. Meanwhile, the front-end circuit 27 is connected to the enable circuit 25 to provide a low voltage level predetermined voltage 30. This ensures that the test circuit 23 stays in a disabled state to prevent the enable circuit 25 and the test circuit 23 from affecting the normal operation of the pixel array 21 of the display apparatus 2.

However, the invention does not limit the front-end circuit 27 to a certain type. The front-end circuit 27 of said embodiment can be a driving circuit to drive the pixel array 21, a flexible printed circuit (FPC) connected to the pixel array 21 and a system side, or any circuit providing a predetermined voltage such as an IC chip on glass (COG).

According to the above-mentioned descriptions of the present invention, the enable circuit is enabled by the predetermined voltage while testing. After testing the display apparatus, the predetermined voltage is continuously provided by the front-end circuit such that the enable circuit stays in the disabled state while the display apparatus is operating. Consequently, the pixel array of the display apparatus can operate normally without being affected by the test circuit and the enable circuit, resulting in a normal display.

The above disclosure is related to the detailed technical contents and inventive features of the present invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A test device for use in a display apparatus, the display apparatus comprising a pixel array and a front-end circuit, the test device comprising:

a test circuit for generating a test signal to test the pixel array; and an enable circuit for determining whether to enable the test circuit in response to a predetermined voltage;

wherein the predetermined voltage is continuously provided by the front-end circuit and stays at a low voltage level while the display apparatus is operating, and the enable circuit is disabled according to the predetermined voltage staying at the low voltage level while the display apparatus is operating such that the test signal provided by the test circuit is not inputted to the pixel array after the pixel array is tested.

2. The test circuit as claimed in claim 1, wherein the front-end circuit comprises a driving circuit for driving the pixel array.

3. The test circuit as claimed in claim 1, wherein the front-end circuit comprises a flexible printed circuit (FPC).

4. A display apparatus, comprising:

a pixel array;

a front-end circuit;

a test circuit for generating a test signal to test the pixel array; and an enable circuit for determining whether to enable the test circuit in response to a predetermined voltage;

wherein the predetermined voltage is continuously provided by the front-end circuit and stays at a low voltage level while the display apparatus is operating, and the enable circuit is disabled according to the predetermined voltage staying at the low voltage level while the display apparatus is operating such that the test signal provided by the test circuit is not inputted to the pixel array after the pixel array is tested.

5. The display apparatus as claimed in claim 4, wherein the front-end circuit comprises a driving circuit for driving the pixel array.

6. The display apparatus as claimed in claim 4, wherein the front-end circuit comprises a flexible printed circuit.

* * * * *